(12) United States Patent
Lee et al.

(10) Patent No.: US 9,899,625 B2
(45) Date of Patent: Feb. 20, 2018

(54) DISPLAY DEVICE

(71) Applicant: Samsung Display Co., Ltd., Yongin-si (KR)

(72) Inventors: Hyesog Lee, Osan-si (KR); Chi-o Cho, Gwangju-si (KR); Jaejoong Kwon, Suwon-si (KR); Byungchoon Yang, Seoul (KR)

(73) Assignee: Samsung Display Co., Ltd, Yongin-si (KR)

( * ) Notice: Subject to any disclaimer, the term of this patent is extended or adjusted under 35 U.S.C. 154(b) by 0 days.

(21) Appl. No.: 14/957,177

(22) Filed: Dec. 2, 2015

(65) Prior Publication Data

US 2016/0336528 A1 Nov. 17, 2016

(30) Foreign Application Priority Data

May 11, 2015 (KR) .......................... 10-2015-0065568

(51) Int. Cl.
*H01L 51/52* (2006.01)
*H01L 27/32* (2006.01)

(52) U.S. Cl.
CPC ...... *H01L 51/5225* (2013.01); *H01L 51/5209* (2013.01); *H01L 51/5262* (2013.01); *H01L 27/3244* (2013.01); *H01L 51/5218* (2013.01); *H01L 51/5265* (2013.01); *H01L 51/5268* (2013.01)

(58) Field of Classification Search
CPC ............. H01L 51/5225; H01L 51/5209; H01L 51/5262; H01L 51/5218; H01L 51/5265; H01L 51/5268
See application file for complete search history.

(56) References Cited

U.S. PATENT DOCUMENTS

| | | | |
|---|---|---|---|
| 5,834,893 A | 11/1998 | Bulovic et al. | |
| 7,432,649 B2 | 10/2008 | West | |
| 8,222,804 B2 | 7/2012 | Miller et al. | |
| 8,373,341 B2 | 2/2013 | Xue et al. | |
| 8,907,365 B2 | 12/2014 | Baker et al. | |
| 2008/0265757 A1 | 10/2008 | Forrest et al. | |

(Continued)

FOREIGN PATENT DOCUMENTS

KR 10-2011-0013691 2/2011
KR 10-2012-0014074 2/2012

(Continued)

OTHER PUBLICATIONS

Bocksrocker et al., "Efficient waveguide mode extraction in white organic light emitting diodes using ITO-anodes with integrated MgF2-columns," Optics Express 20(6), 2012, pp. 6170-6174.

*Primary Examiner* — Douglas Menz
(74) *Attorney, Agent, or Firm* — H.C. Park & Associates, PLC

(57) ABSTRACT

A display device includes pixels, each pixel including a first electrode, a first organic layer disposed on the first electrode, and a second electrode disposed on the first organic layer, in which the first electrode includes a first overlapping electrode portion overlapping each of the first organic layer and the second electrode, and a first non-overlapping electrode portion not overlapping the first organic layer and the second electrode, and connected to the first overlapping electrode portion.

18 Claims, 16 Drawing Sheets

(56) References Cited

U.S. PATENT DOCUMENTS

2011/0025723 A1 2/2011 Kim
2014/0292622 A1 10/2014 Lee
2016/0005800 A1* 1/2016 Paek .................. H01L 27/3246
　　　　　　　　　　　　　　　　　　　257/40

FOREIGN PATENT DOCUMENTS

KR   　10-1163936   　7/2012
KR   10-2014-0118010   10/2014
KR   10-2015-0001182   　1/2015

* cited by examiner

DISPLAY DEVICE

CROSS-REFERENCE TO RELATED APPLICATION

This application claims priority from and the benefit of Korean Patent Application No. 10-2015-0065568, filed on May 11, 2015, which is hereby incorporated by reference for all purposes as if fully set forth herein.

BACKGROUND

Field

Exemplary embodiments relate to a display device. More particularly, exemplary embodiments relate to a display device with improved light efficiency.

Discussion of the Background

Flat panel display devices may be generally divided into a light emitting type and a light receiving type. The light emitting type may include a flat cathode ray tube, a plasma display panel, an organic light emitting display (OLED), and the like. The organic light emitting display may be a self-light emitting type display, which has a wide viewing angle, an excellent contrast, and a fast response rate, thus attracting attention as a next generation display device.

The OLED may realize a color when a hole and an electron injected from first and second electrodes are recombined in an emitting layer to generate an exciton, and the exciton falls from an excited state to a ground state to emit light. Technologies for enhancing extraction efficiency of light generated in the emitting layer may reduce process costs, provide high quality display devices, etc.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device with improved light efficiency.

Additional aspects will be set forth in the detailed description which follows, and, in part, will be apparent from the disclosure, or may be learned by practice of the inventive concept.

An exemplary embodiment discloses a display device including pixels, each pixel including a first electrode, a first organic layer disposed on the first electrode, and a second electrode disposed on the first organic layer, in which the first electrode includes a first overlapping electrode portion overlapping each of the first organic layer and the second electrode, and a first non-overlapping electrode portion not overlapping the first organic layer and the second electrode, and connected to the first overlapping electrode portion.

The first overlapping electrode portion may surround the first non-overlapping electrode portion, as viewed from above.

The display device may further include a second organic layer disposed on at least a portion of the first non-overlapping electrode portion and connected to the first organic layer.

The area of the first non-overlapping electrode portion as viewed from above may be about 5% to about 30% of the total area of the first electrode.

The first organic layer may include first inner walls and the display device may satisfy Equation 1:

$$X > Y \quad \text{(Equation 1)},$$

where X refers to a sum of the respective areas of the first inner walls and Y refers to a total area of the first non-overlapping electrode portions, as viewed from above.

The second electrode may include second inner walls and the display device may satisfy Equation 2:

$$Z > Y \quad \text{(Equation 2)},$$

where Z refers to a sum of areas of the second inner walls and Y refers to a total area of the first non-overlapping electrode portion.

The shape of the first non-overlapping electrode portion as viewed from above may be defined as at least one of straight lines and curved lines.

The first non-overlapping electrode portion may include a first region, a second region spaced apart from the first region, a third region connecting the first and second regions to each other, a fourth region connected to the first region, and a fifth region connected to the second region and spaced apart from the fourth region.

The third region may be disposed at a first end of each of the first and second regions, the fourth region may be disposed at a second end of the first region, and the fifth region may be disposed at the second end of the second region.

The first non-overlapping electrode portion may be provided in plurality and the plurality of first non-overlapping portions as viewed from above may be spaced apart from each other.

The first organic layer as viewed from above may include a first sub-region, a second sub-region spaced apart from the first sub-region, and a third sub-region connecting the first and second sub-regions to each other.

Each of the first and third sub-regions may have a rectangular shape, and the second sub-region may have a rectangular ring shape.

The second electrode as viewed from above may include a first sub-region, a second sub-region spaced apart from the first sub-region, and a third sub-region connecting the first and second sub-regions to each other.

The first organic layer as viewed from above may include a first sub-region, a second sub-region spaced apart from the first sub-region, and a third sub-region connecting the first and second sub-regions to each other. The second electrode may include a first sub-region, a second sub-region spaced apart from the first sub-region, and a third sub-region connecting the first and second sub-regions to each other. The first sub-region of the second electrode may be disposed on the first sub-region of the first organic layer, the second sub-region of the second electrode may be disposed on the second sub-region of the first organic layer, and the third sub-region of the second electrode may be disposed on the third sub-region of the first organic layer.

One of the first and second electrodes may include a reflective electrode, and the other of the first and second electrodes may include a transflective electrode.

A distance between the first and second electrodes of a first pixel emitting light of a first color may be different from a distance between the first and second electrodes of a second pixel emitting light of a second color different from the first color.

The first organic layer may include a hole transport region, an emitting layer, and an electron transport region.

An exemplary embodiment further discloses a display device including pixels, each pixel including a first electrode, an organic layer disposed on the first electrode, and a second electrode disposed on the organic layer, the second electrode comprising a first hole.

The organic layer may include a second hole overlapping the first hole.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
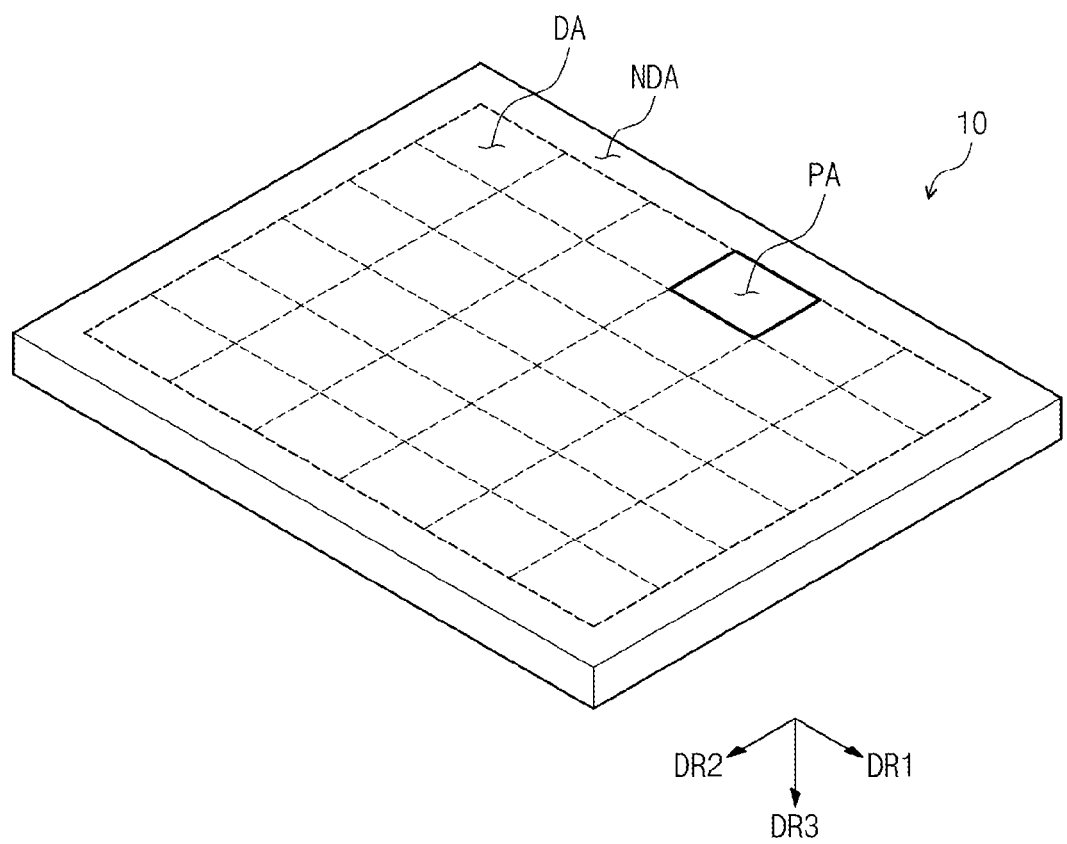
FIG. 1 schematically illustrates a perspective view of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, a display device according to an embodiment of the inventive concept will be described.

FIG. 1 schematically illustrates a perspective view of a display device according to an exemplary embodiment.

Referring to FIG. 1, a display device 10 according to the present exemplary embodiment includes a display region DA and a non-display region NDA.

The display region DA may display an image. When viewed from a thickness direction DR3 of the display device 10, the display region DA may have approximately a rectangular shape.

The display region DA includes pixel regions PA. The pixel regions PA may be arranged in a matrix shape. The pixel regions PA may be defined by gate lines (GL in FIG. 2), data lines (DL in FIG. 2), and driving voltage lines (DVL in FIG. 2). Each of the pixel regions PA may include pixels (PX in FIG. 2). The pixels regions PA may have a rectangular shape. Alternatively, the pixel regions PA may have a circular shape.

The non-display region NDA may not display an image. When viewed from the thickness direction DR3 of the display device 10, the non-display region NDA may surround the display region DA. The non-display region NDA may be adjacent to the display region DA in a first direction DR1 and a second direction DR2 crossing the first direction DR1.

Figure 2:
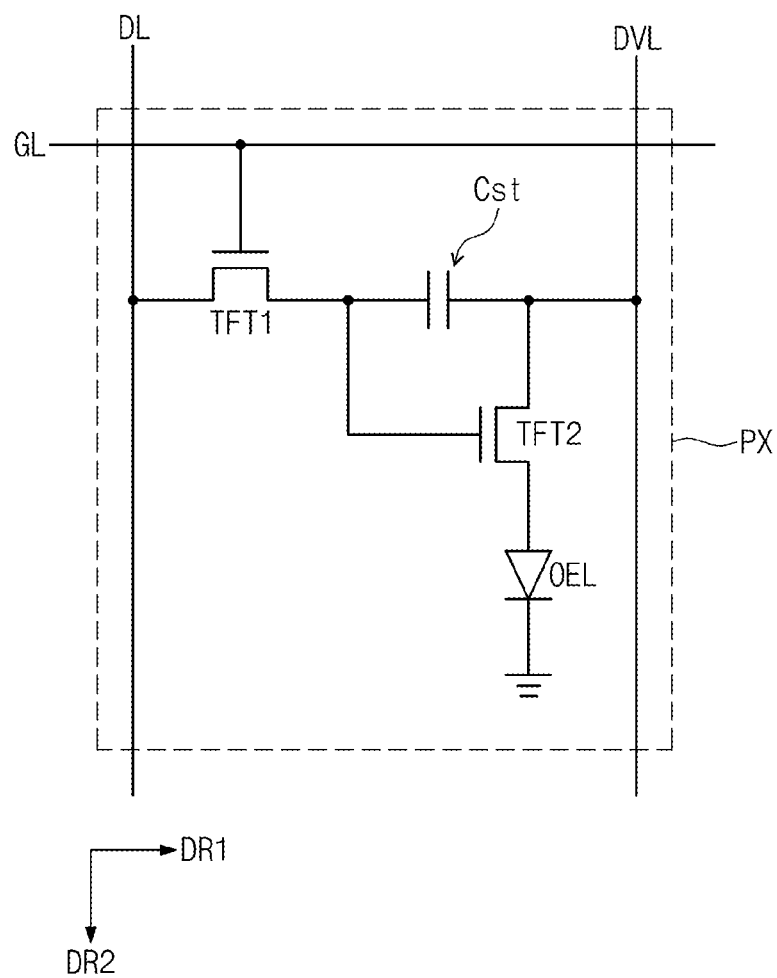
FIG. 2 illustrates a circuit diagram of one pixel included in a display device according to an exemplary embodiment.
Figure 3:
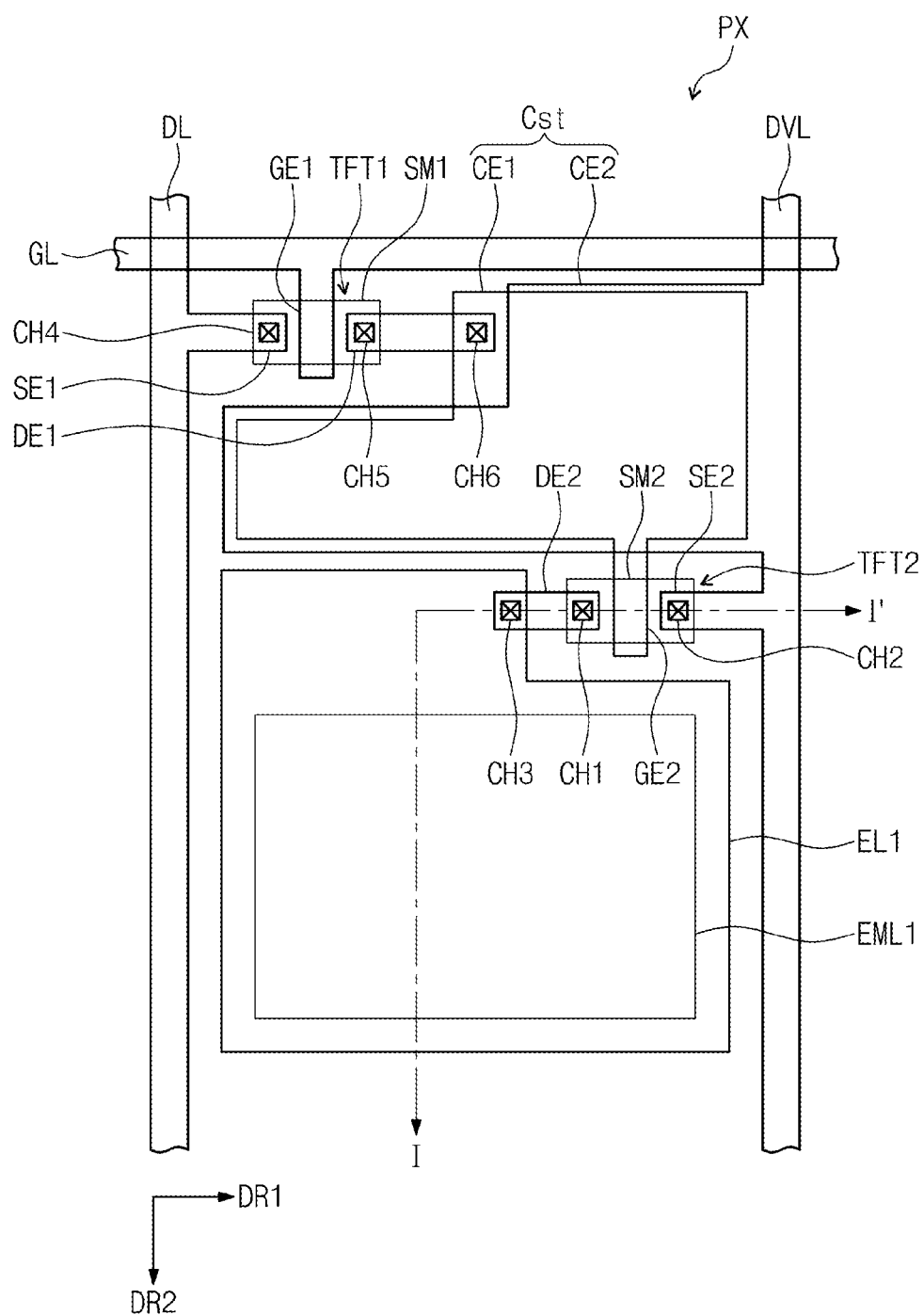
FIG. 3 illustrates a plan view of one pixel included in a display device according to an exemplary embodiment.
Figure 4:
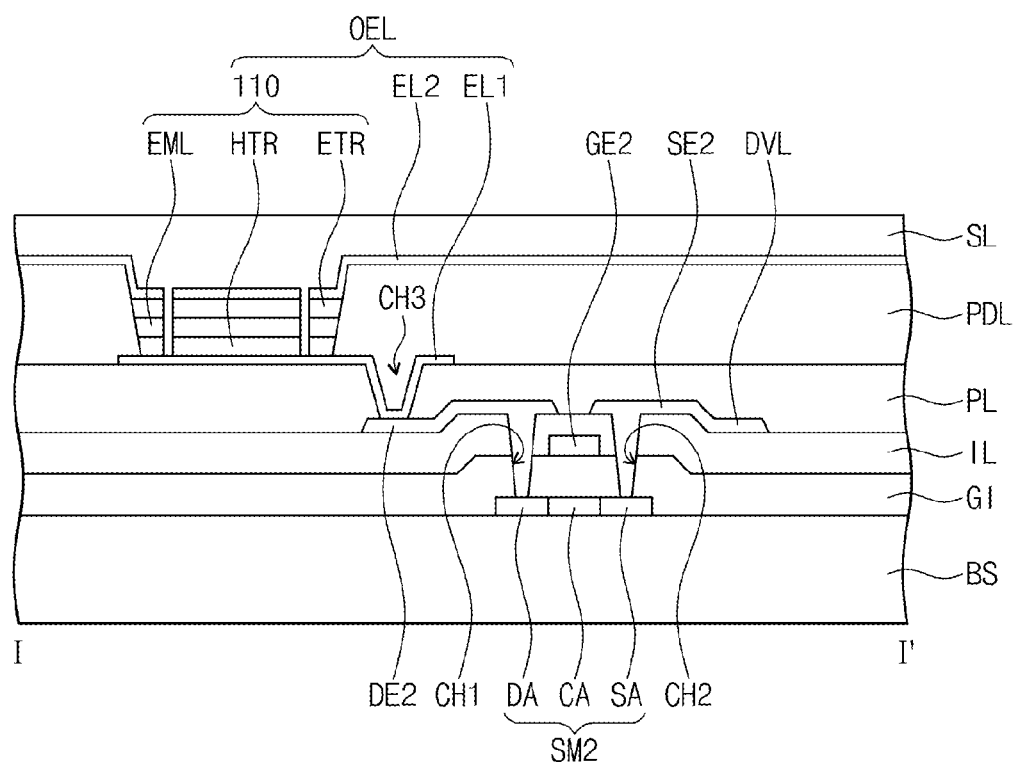
FIG. 4 schematically illustrates a cross-sectional view taken along line I-I' of FIG. 3.

FIG. 2 illustrates a circuit diagram of one pixel included in a display device according to an exemplary embodiment. FIG. 3 illustrates a plan view of one pixel included in a display device according to an exemplary embodiment. FIG. 4 schematically illustrates a cross-sectional view taken along line I-I' of FIG. 3.

Referring to FIGS. 2 to 4, each of the pixels PX may be connected to a wiring part including gate lines GL, data lines DL, and driving voltage lines DVL. Each of the pixels PX includes thin-film transistors TFT1 and TFT2 connected to the wiring part and an organic light emitting diode OEL, and a capacitor Cst connected to thin-film transistors TFT1 and TFT2.

According to an exemplary embodiment, multiple pixels PX may be connected to one gate line GL, one data line DL, and one driving voltage line DVL. Alternatively, one pixel may be connected to at least one gate line GL, at least one data line DL, and at least one driving voltage line DVL.

Each of the pixels PX may emit light of a specific color, e.g., one of red, green, and blue light. Alternatively, the color of light may further include, e.g., cyan, magenta, yellow colors, and the like.

The gate lines GL extend in the first direction DR1. The data lines DL extend in the second direction DR2 crossing the gate lines GL. The driving voltage lines DVL extend substantially in the same direction as the data lines DL, i.e. the second direction DR2. The gate lines GL may transmit a scan signal to the thin-film transistors TFT1 and TFT2, the data lines DL may transmit a data signal to the thin-film transistors TFT1 and TFT2, and the driving voltage lines DVL may provide a driving voltage to the thin-film transistors TFT1 and TFT2.

The thin-film transistors TFT1 and TFT2 may include a driving thin-film transistor TFT2 for controlling the organic light emitting diode OEL, and a switching thin-film transistor TFT1 for switching the driving thin-film transistor TFT2. According to an exemplary embodiment, each of the pixels PX may include one thin-film transistor and one capacitor, or may include three or more thin-film transistors and two or more capacitors.

The switching thin-film transistor TFT1 may include a first gate electrode GE1, a first source electrode SE1, and a first drain electrode DE1. The first gate electrode GE1 is connected to the gate line GL, and the first source electrode SE1 is connected to the data line DL. The first drain electrode DE1 is connected to a first common electrode CE1 through a fifth contact hole CH5. The switching thin-film transistor TFT1 may transmit a data signal applied to the data line DL to the driving thin-film transistor TFT2, according to a scan signal applied to the gate line GL.

The driving thin-film transistor TFT2 includes a second gate electrode GE2, a second source electrode SE2, and a second drain electrode DE2. The second gate electrode GE2 is connected to the first common electrode CE1. The second source electrode SE2 is connected to the driving voltage line DVL. The second drain electrode DE2 is connected to the first electrode EL1 through a third contact hole CH3.

The first electrode EL1 is connected to the second drain electrode DE2 of the driving thin-film transistor TFT2. A common voltage is applied to the second electrode EL2, and an emitting layer EML may emit a blue light, according to an output signal of the driving thin-film transistor TFT2, to display an image. The first and second electrodes EL1 and EL2 will be described in more detail below.

The capacitor Cst is connected between the second gate electrode GE2 of the driving thin-film transistor TFT2 and the second source electrode SE2. The capacitor Cst may be charged with and hold a data signal input to the second gate electrode GE2 of the driving thin-film transistor TFT2. The capacitor Cst may include the first common electrode CE1 connected to the first drain electrode DE1 through a sixth contact hole CH6, and a second common electrode CE2 connected to the driving voltage line DVL.

Referring to FIGS. 3 and 4, the display device 10 according to the present exemplary embodiment includes a base substrate BS, on which the thin-film transistors TFT1 and TFT2 and the organic light emitting diode OEL are disposed. The base substrate BS may be formed of a typically available material, for example, an insulating material, such as glass, plastic, or a crystal material. An organic polymer forming the base substrate BS may be polyethylene terephthalate (PET), polyethylene naphthalate (PEN), polyimide, polyether sulfone, or the like. The base substrate BS may be selected in consideration of mechanical strength, thermal stability, transparency, surface smoothness, easiness of handling, water resistance, or the like.

A substrate buffer layer (not shown) may be disposed on the base substrate BS. The substrate buffer layer (not shown) may prevent an impurity from diffusing into the switching thin-film transistor TFT1 and the driving thin-film transistor TFT2. Silicon nitride (SiNx), silicon oxide (SiOx), silicon oxynitride (SiOxNy), or the like may form the substrate buffer layer (not shown) and may be omitted according to a material and a process condition of the base substrate BS.

A first semiconductor layer SM1 and a second semiconductor layer SM2 may be disposed on the base substrate BS. The first and second semiconductor layers SM1 and SM2 are formed of semiconductor materials, and respectively operate as active layers of the switching thin-film transistor TFT1 and the driving thin-film transistor TFT2. Each of the first and second semiconductor layers SM1 and SM2 includes a source region SA, a drain region DA, and a channel region CA between the source region SA and the drain region DA. Each of the first and second semiconductor layers SM1 and SM2 may include an organic semiconductor material or an inorganic semiconductor material. The source region SA and the drain region DA may be doped with an n-type impurities or p-type impurities.

A gate insulating layer GI may be disposed on the first and second semiconductor layers SM1 and SM2. The gate insulating layer GI covers the first and second semiconductor layers SM1 and SM2. The gate insulating layer GI may be formed of an organic or inorganic insulating material.

First and second gate electrodes GE1 and GE2 may be disposed on the gate insulating layer GI. The first and second gate electrodes GE1 and GE2 may respectively cover regions corresponding to the channel regions CA of the first and second semiconductor layers SM1 and SM2.

An interlayer insulating layer IL may be disposed on the first and second gate electrodes GE1 and GE2. The interlayer insulating layer IL covers the first and second gate electrodes GE1 and GE2. The interlayer insulating layer IL may be formed of an organic or inorganic insulating material.

First source electrode SE1, first drain electrode DE1, second source electrode SE2, and second drain electrode DE2 may be disposed on the interlayer insulating layer IL. The second drain electrode DE2 contacts the drain region DA of the second semiconductor layer SM2 through a first contact hole CH1 formed on the gate insulating layer GI and the interlayer insulating layer IL. The second source electrode SE2 contacts the source region SA of the second semiconductor layer SM2 through a second contact hole CH2 formed on the gate insulating layer GI and the interlayer insulating layer IL. The first source electrode SE1 contacts the source region (not shown) of the first semiconductor layer SM1 through a fourth contact hole CH4 formed on the gate insulating layer GI and the interlayer insulating layer IL. The first drain electrode DE1 contacts the drain region (not shown) of the first semiconductor layer SM1 through the fifth contact hole CH5 formed on the gate insulating layer GI and the interlayer insulating layer IL.

A passivation layer PL may be disposed on the first source electrode SE1, the first drain electrode DE1, the second source electrode SE2, and the second drain electrode DE2. The passivation layer PL may be a protective film protecting the switching thin-film transistor TFT1 and the driving thin-film transistor TFT2, or a planarization film to planarize a top surface of the switching thin-film transistor TFT1 and the driving thin-film transistor TFT2.

The first electrode EL1 may be disposed on the passivation layer PL. The first electrode EL1 may be an anode. The first electrode EL1 is connected to the second drain electrode DE2 of the driving thin-film transistor TFT2 through the third contact hole CH3 formed on the passivation layer PL.

A pixel defining layer PDL may be disposed on the passivation layer and define pixel regions (PA in FIG. 1), such that each of the pixel regions correspond to the respective pixels PX. The pixel defining layer PDL exposes a top surface of the first electrode EL1 and protrudes from the base substrate BS along a perimeter of each of the pixels PX. The pixel defining layer PDL may include a metal-fluorine ion compound, such as lithium fluoride (LiF), barium fluoride ($BaF_2$), or caesium fluoride (CsF). When the pixel defining layer PDL has a predetermined thickness, the metal-fluorine ion compound may have an insulating property. The thickness of the pixel defining layer PDL may range from about 10 nm to about 100 nm.

The organic light emitting diode OEL may be disposed on each of the pixel regions (PA in FIG. 1) surrounded by the pixel defining layer PDL. The organic light emitting diode OEL includes the first electrode EL1, a hole transport region HTR, the emitting layer EML, an electron transport region ETR, and the second electrode EL2.

The first electrode EL1 may be conductive. The first electrode EL1 may be a pixel electrode or an anode. The first electrode EU may be a transmissive electrode, a transflective electrode, or a reflective electrode. When the first electrode EL1 is a transmissive electrode, the first electrode EL1 may be formed of a transparent metal oxide, for example, indium tin oxide (ITO), indium zinc oxide (IZO), zinc oxide (ZnO), or indium tin zinc oxide (ITZO). When the first electrode EL1 is a transflective electrode or a reflective electrode, the first electrode EL1 may include silver (Ag), magnesium (Mg), aluminum (Al), platinum (Pt), palladium (Pd), gold (Au), nickel (Ni), neodymium (Nd), iridium (Ir), chrome (Cr), or a mixture thereof.

The first electrode EL1 includes a first overlapping electrode portion (200 in FIG. 5) overlapping a first organic layer 110 and the second electrode EL2, and a first non-overlapping electrode portion 300 not overlapping the first organic layer 110 and the second electrode EL2. The first electrode EL1 may have various shapes as viewed from above, which will be described in more detail below. The term "as viewed from above" used herein may mean, for example, when an object is viewed from the thickness direction DR3.

The first organic layer 110 may be disposed on the first electrode EL1. The first organic layer 110 includes the emitting layer EML. The first organic layer 110 may further include the hole transport region HTR and the electron transport region ETR.

The hole transport region HTR may be disposed on the first electrode EL1. The hole transport region HTR may include at least one of a hole injection layer HIL, the hole transport layer HTL, a hole buffer layer, and an electron blocking layer. The hole transport region HTR may have a single layer structure formed of a single material, a single layer structure formed of different materials, or may have a multi-layer structure formed of different materials.

The hole transport region HTR may have a single layer structure including different materials, or a multi-layer structure, such as hole injection layer HIL/hole transport layer HTL, hole injection layer HIL/hole transport layer HTL/hole buffer layer, hole injection layer HIL/hole buffer layer, hole transport layer HTL/hole buffer layer, and hole injection layer HIL/hole transport layer HTL/electron blocking layer, in which the respective layers are sequentially stacked on the first electrode EL1. The hole transport region HTR may be formed by using any of various methods, e.g., vacuum deposition, spin coating, casting, a Langmuir-Blodgett method, an inkjet printing method, a laser printing method, and a laser induced thermal imaging (LITI) method.

When the hole transport region HTR includes the hole injection layer HIL, the hole transport region HTR may include a phthalocyanine compound, e.g., copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-Tris(N,N-diphenylamino)triphenylamine (TDATA), 4,4',4"-tris{N,-(2-naphthyl)-N-phenylamino}-triphenylamine (2TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonicacid (PANI/CSA), and (Polyaniline)/Poly(4-styrenesulfonate) (PANI/PSS).

When the hole transport region HTR includes the hole transport layer HTL, the hole transport region HTR may include a carbazole derivative, e.g., N-phenyl carbazole, polyvinyl carbazole, a fluorine derivative, a triphenylamine derivative, such as N,N'-bis(3-methylphenyl)-N,N'-diphenyl-[1,1-biphenyl]-4,4'-diamine (TPD), 4,4',4"-tris(N-carbazolyl)triphenylamine (TCTA), N,N'-di(1-naphthyl)-N,N'-diphenylbenzidine (NPB), and 4,4'-Cyclohexylidene bis[N,N-bis(4-methylphenyl)benzenamine] (TAPC).

The thickness of the hole transport region HTR may range from about 100 Å to about 10000 Å, and in more detail, from about 100 Å to about 1000 Å. When the hole transport region HTR includes both the hole injection layer HIL and hole transport layer HTL, the thickness of the hole injection layer HIL may range from about 100 Å to about 10000 Å, and in more detail, from about 100 Å to about 1000 Å, and the thickness of the hole transport layer HTL may range from about 50 Å to about 2000 Å, and in more detail, from about 100 Å to about 1500 Å. When the thicknesses of the hole transport layer HTR, the hole injection layer HIL, and hole transport layer HTL are within the above mentioned ranges, a satisfactory hole transport property may be obtained without substantially raising a driving voltage.

The hole transport region HTR may further include a charge generating material, to improve the conductivity thereof in addition to above-mentioned material(s). The charge generating material may be uniformly or non-uniformly dispersed into the hole transport region HTR. The charge generating material may be, e.g., a p-dopant material. The p-dopant material may be one of a quinine derivative, a metal oxide, and a cyano group-containing compound. For example, the p-dopant material may include a quinone derivative, e.g., tetracyanoquinodimethane (TCNQ) or 2,3,5,6-tetrafluoro-tetracyanoquinodimethane (F4-TCNQ), and a metal oxide, e.g., tungsten oxide or molybdenum oxide.

As previously mentioned, the hole transport region HTR may include at least one of the hole buffer layer and the electron blocking layer, in addition to the hole injection layer HIL and the hole transport layer HTL. The hole buffer layer may improve light emitting efficiency by compensating for a resonance distance according to a wavelength of light emitted from the emitting layer EML. The hole transport region HTR and the hole buffer layer may include the same material. The electron blocking layer may prevent an electron from being injected into the hole transport region HTR from the electron transport region ETR.

The emitting layer EML may be disposed on the hole transport region HTR. The emitting layer EML may be a single layer formed of a single material, or a single layer formed of different materials, or may have a multi-layer structure formed of different materials. The emitting layer EML may be formed of any suitable material, e.g., a material emitting red, green, and blue light, and may include a fluorescent material or a phosphorescent material. Further, the emitting layer EML may include a host material and a dopant material.

The host material may include tris(8-hydroxyquinolino) aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBi), 3-tert-butyl-9,10-di(naphth-2-yl) anthracene (TBADN), distyrylarylene (DSA), 4,4'-bis(9-carbazolyl)-2,2'-dimethyl-biphenyl (CDBP), 2-Methyl-9,10-bis(naphthalen-2-yl)anthracene (MADN), and the like.

When the emitting layer EML emits red light, the emitting layer EML may include a fluorescent material including tris(dibenzoylmethanato)phenanthoroline europium (PBD: Eu(DBM)3(Phen)) or perylene. When the emitting layer EML emits red light, the dopant material included in the emitting layer EML may be selected from a metal complex or an organometallic complex, e.g., acac(bis(1-phenylisoquinoline)acetylacetonate iridium (PIQIr), acac(bis(1-phenylquinoline)acetylacetonate iridium (PQIr), tris(1-phenylquinoline)iridium (PQIr), and octaethylporphyrin platinum (PtOEP).

When the emitting layer EML emits green light, the emitting layer EML may include a fluorescent material including tris(8-hydroxyquinolino)aluminum (Alq3). When the emitting layer EML emits green light, the dopant material included in the emitting layer EML may be selected from a metal complex or an organometallic complex, such as fac-tris(2-phenylpyridine)iridium (Ir(ppy)3).

When the emitting layer EML emits blue light, the emitting layer EML may include a fluorescent material including at least one of spiro-DPVBi, spiro-6P, distyryl-benzene (DSB), distyryl-arylene (DSA), Polyfluorene (PFO) polymers, and poly(p-phenylene vinylene (PPV) polymers. When the emitting layer EML emits blue light, the dopant material included in the emitting layer EML may be selected from a metal complex or an organometallic complex, such as (4,6-F2ppy)2Irpic. The emitting layer EML will be described in more detail below.

The electron transport region ETR may be disposed on the emitting layer EML. The electron transport region ETR may include, but is not limited to, at least one of the hole blocking layer, the electron transport layer, and the electron injection layer.

When the electron transport region ETR includes the electron transport layer ETL, the electron transport region ETR may include Tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate) (Bebq2), 9,10-di(naphthalene-2-yl) anthracene (ADN), and a mixture thereof. The thickness of the electron transport layer may range from about 100 Å to about 1000 Å, and in more detail, from about 150 Å to about 500 Å. When the thickness of the electron transport layer is within the above mentioned range, a satisfactory electron transport property may be obtained without substantially raising the driving voltage.

When the electron transport region ETR includes the electron injection layer, the electron transport region ETR may include lithium fluoride (LiF), lithium quinolate (LiQ), lithium oxide ($Li_2O$), barium oxide (BaO), sodium chloride (NaCl), caesium fluoride (CsF), a lanthanide metal, e.g., ytterbium (Yb), or a metal halide, e.g., rubidium chloride (RbCl), rubidium iodide (RbI). The electron injection layer may also include a material, in which an electron transport material and an insulating organo metal salt are mixed. The organo metal salt may be a material having an energy band gap of about 4 eV or higher. The organic metal salt may include metal acetate, metal benzoate, metal acetoacetate, metal acetylacetonate, or metal stearate. The thickness of the electron injection layer may range from about 1 Å to about 100 Å, and in more detail, from about 3 Å to about 90 Å. When the thickness of the electron injection layer is within the above mentioned range, a satisfactory electron injection property may be obtained without substantially raising the driving voltage.

The electron transport region ETR may include the hole blocking layer. The hole blocking layer may include at least one of 2,9-dimethyl-4,7-diphenyl-1,10-phenanthroline (BCP) and 4,7-diphenyl-1,10-phenanthroline (Bphen).

The second electrode EL2 may be disposed on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may include Li, Ca, LiF/Ca, LiF/Al, Al, Mg, BaF, Ba, Ag, or a compound thereof, or a mixture thereof (e.g., a mixture of Ag and Mg).

The second electrode EL2 may include an auxiliary electrode. The auxiliary electrode may include a film formed to face the emitting layer, by depositing any transparent metal oxide film on the film. The transparent metal oxide film may include indium tin oxide (ITO), indium zinc oxide (IZO), zinc oxide (ZnO), or indium tin zinc oxide (ITZO). Alternatively, the auxiliary electrode may include Mo and Ti.

When the second electrode EL2 is a transflective electrode or a reflective electrode, the second electrode EL2 may include Ag, Mg, Al, Pt, Pd, Au, Ni, Nd, Ir, Cr, Li, Ca, LiF/Ca, LiF/Al, Mo, Ti, or a compound thereof, or a mixture thereof (e.g., a mixture of Ag and Mg). Alternatively, the second electrode EL2 may have a multi-layer structure including a reflective film or transflective film formed of a transparent conductive film including indium tin oxide (ITO), indium zinc oxide (IZO), zinc oxide (ZnO), indium tin zinc oxide (ITZO), or the like.

When the organic light emitting diode OEL is a top emission type organic light emitting diode, the first electrode layer EL1 may be a reflective electrode, and the second electrode EL2 may be a transmissive electrode or a transflective electrode. When the organic light emitting diode is a bottom emission type organic light emitting diode, the first electrode EL1 may be a transmissive electrode or a transflective electrode and the second electrode EL2 may be a reflective electrode.

In the organic light emitting diode OEL, as respective voltages are applied to the first and second electrodes EL1 and EL2, a hole injected from the first electrode EL1 moves to the emitting layer EML through the hole transport region HTR, and an electron injected from the second electrode EL2 moves to the emitting layer EML through the electron transport region ETR. The electron and the hole are recombined in the emitting layer EML to generate an exciton and the exciton emits light when falling from an excited state to a ground state.

An encapsulation layer SL covering the second electrode EL2 may be disposed on the second electrode EL2. The encapsulation layer SL may include at least one of a first organic layer or an inorganic layer. The encapsulation layer SL protects the organic light emitting diode OEL.

Although not illustrated, an organic capping layer may be disposed on the second electrode EL2. The organic capping layer may reflect light emitted from the emitting layer EML from a top surface of the organic capping layer to the direction of the emitting layer EML. The reflected light may be amplified inside the first organic layer 110 by a resonance effect, such that light efficiency of the display device 10 may be improved. The organic capping layer may prevent light from being lost in the second electrode EL2 through total reflection of light in the top emission type organic light emitting diode.

Referring to FIGS. 5 to 13, the display device 10 according to an exemplary embodiment will be described hereinafter in more detail.

Figure 5:
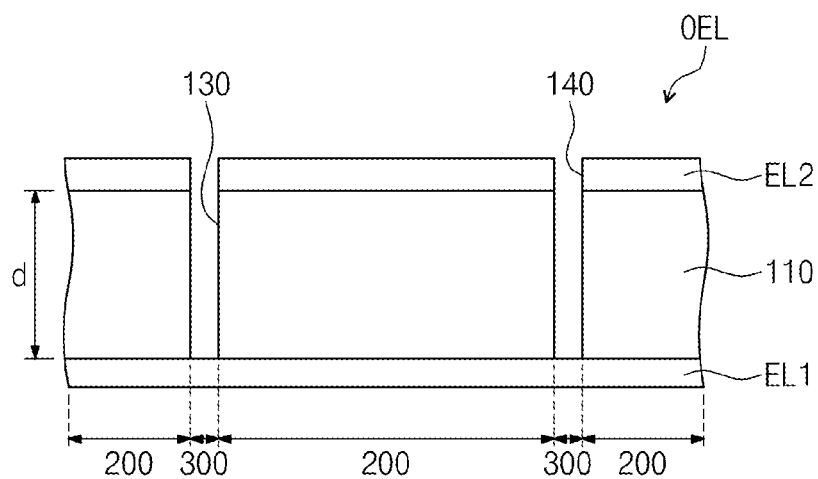
FIG. 5 schematically illustrates an enlarged cross-sectional view of a portion of an organic light emitting diode of FIG. 4.

The display device 10 according to the present exemplary embodiment includes a plurality of pixels (PX in FIG. 2). Referring to FIG. 5, each of the pixels PX includes the first electrode EL1, the first organic layer 110, and the second electrode EL2, as described above.

The first electrode EL1 includes the first overlapping electrode portion 200 overlapping each of the first organic layer 110 and the second electrode EL2, and the first non-overlapping electrode portion 300 not overlapping the first organic layer 110 and the second electrode EL2. The first non-overlapping electrode portion 300 is connected to the first overlapping electrode portion 200. The first non-overlapping electrode portion 300 may be connected to the first overlapping electrode portion 200 to be integrated.

In general, an amount of light lost in each of the pixels may be about 80% or more, and an amount of light lost in the organic layer may be relatively large, due to the relatively thick organic layer. In the display device 10 according to the present exemplary embodiment, light extraction efficiency may be improved (or enhanced) by forming a region, which does not overlap the first electrode EL1 in the first organic layer 110 and the second electrode EL2, to increase paths into which light generated in the organic layer may be extracted. In this manner, the first non-overlapping electrode portion 300 may serve as a reflector reflecting the extracted light.

Forming a region, which does not overlap the first electrode EL1 in the first organic layer 110 and the second electrode EL2 may mean, for example, that the organic layer 100 includes the second hole H2 and the second electrode EL2 includes the first hole H1. In this manner, the first organic layer 110 may be defined by the second hole H2. A method of forming the first and second holes H1 and H2 may be performed by a method known in the art and is not particularly limited.

The first overlapping electrode portion 200 may surround the first non-overlapping electrode portion 300 as viewed from above. An area of the first non-overlapping electrode portion 300 may be about 5% to about 30% of a total area of the first electrode EL1 as viewed from above. When the area of the first non-overlapping electrode portion 300 is smaller than 5% of the total area of the first electrode EL1, an improved effect of light extraction may be insufficient in the organic layer, and when the area of the first non-overlapping electrode portion 300 is greater than 30% of the total area of the first electrode EL1, there is a limitation in that the first and second holes H1 and H2 may be visible from outside.

The first organic layer 110 includes first inner walls 130. Each of the first inner walls 130 may be vertical or substantially vertical to the first electrode EL1, but may not necessarily be vertical.

The display device 10 according to an exemplary embodiment may satisfy Equation 1.

$$X > Y \qquad \text{Eq. 1}$$

In Equation 1, X denotes a sum of respective areas of the first inner walls 130 and Y denotes a total area of the first non-overlapping electrode portion 300 as viewed from above.

The first inner walls 130 may include a first sub-inner wall 501, a second sub-inner wall 502, a third sub-inner wall 503, a fourth sub-inner wall 504, a fifth sub-inner wall 505, a sixth sub-inner wall 511, a seventh sub-inner wall 512, an eighth sub-inner wall 513, a ninth sub-inner wall 514, a tenth sub-inner wall 515, an eleventh sub-inner wall 521, and a twelfth sub-inner wall 522. In detail, the first to fourth sub-inner walls 501 to 504 are the first inner walls 130 forming a first sub-region 500 as viewed from above of the first organic layer 110, the sixth to tenth sub-inner walls 511 to 515 are the first inner walls 130 forming a second sub-region 510 on the plane of the first organic layer 110, and the eleventh and twelfth sub-inner walls 521 and 522 are the first inner walls 130 forming a third sub-region 520 on the plane of the first organic layer 110. For example, X may be a sum of respective areas of the first to twelfth sub-inner walls 501 to 522.

When Equation 1 is satisfied, an area of a light extraction path obtained may be greater than an area of a light extraction path lost by drilling a hole in the first organic layer 110, and thus overall light extraction efficiency may be improved.

Each of the first inner walls 130 of the first organic layer 110 may have a greater surface roughness value than a surface in contact with the second electrode EL2 of the first organic layer 110, due to a hole drilling process. A light-scattering effect of light extracted from the first inner wall 130 of the first organic layer 110 may be relatively large, due to the relatively great surface roughness value of each of the first inner walls 130, and thus, light extraction efficiency may be further improved. An additional process may be performed so as to increase surface the roughness value of each of the first inner walls 130.

The second electrode EL2 includes second inner walls 140. Each of the second inner walls 140 may be vertical or substantially vertical to the first electrode EL1, but may not necessarily be vertical. The first organic layer 110 may include the hole transport region, the emitting layer, and the electron transport region as described above.

The display device 10 according to an exemplary may satisfy Equation 1-2.

$$X' > Y \qquad \text{Eq. 1-2}$$

In Equation 2, X' denotes a sum of respective areas of the inner walls corresponding to the emitting layer of the first inner walls 130 of the first organic layer 110, and Y denotes a total area of the first non-overlapping electrode portion 300 as viewed from above.

As described above, the display device 10 according to an exemplary embodiment may reduce the amount of light lost in the organic layer, and more specifically, reduce the amount of light lost, which fails to be emitted in the organic layer and absorbed in a waveguide mode. The waveguide mode may be a proceeding of light in waveguide when a waveguide condition is met. In Equation 1-2, X' denotes an increased amount of a path, in which light generated in the emitting layer of the organic layer is extractable in the waveguide mode, and Y denotes a decreased amount of a path, in which light generated in the emitting layer of the organic layer is extractable in the waveguide mode. Accordingly, when the display device 10 according to an exemplary embodiment satisfies Equation 1-2, the light extraction effect may be improved.

The display device 10 according to an exemplary embodiment may also satisfy Equation 1-3.

$$X'' > Y' \qquad \text{Eq. 1-3}$$

In equation 1-3, X'' denotes an absolute value of a total perimeter length of the first non-overlapping electrode portions 300 as viewed from above, and Y' denotes an absolute value of a total area of the first non-overlapping electrode portions 300 as viewed from above. In more detail, X'' refers to an absolute value of a total perimeter length of the shape of the first non-overlapping electrode portions 300 as viewed from above.

The display device 10 according to an exemplary embodiment may satisfy Equation 2.

$$Z > Y \qquad \text{Eq. 2}$$

In Equation 2, Z denotes a sum of respective areas of the second inner walls 140, and Y denotes a total area of the first non-overlapping electrode portions 300 as viewed from above.

The second inner walls 140 may include, for example, a thirteenth sub-inner wall 601, a fourteenth sub-inner wall 602, a fifteenth sub-inner wall 603, a sixteenth sub-inner wall 604, a seventeenth sub-inner wall 605, an eighteenth sub-inner wall 611, a nineteenth sub-inner wall 612, a twentieth sub-inner wall 613, a twenty-first sub-inner wall 614, a twenty-second sub-inner wall 615, a twenty-third sub-inner wall 621, and a twenty-fourth sub-inner wall 622. In detail, the thirteenth to seventeenth sub-inner walls 601 to 605 are the second inner walls 140 forming a first sub-region 600 of the second electrode EL2 as viewed from above, the eighteenth to twenty-second sub-inner walls 611 to 615 are the second inner walls 140 forming a second sub-region 610 of the second electrode EL2 as viewed from above, and the twenty-third and twenty-fourth sub-inner walls 621 and 622 are the second inner walls 140 forming a third sub-region 620 of the second electrode EL2 as viewed from above. For example, Z may be a sum of respective areas of the thirteenth to twenty-fourth sub-inner walls 601 to 622.

The display device 10 according to an exemplary embodiment may have a micro cavity structure. Light of a specific wavelength may be amplified and light of other wavelengths may be offset, and thus a strong interference effect may be generated between lights, as light is repeatedly reflected by a reflective layer and a transflective layer, which are spaced apart from each other at a predetermined distance. Such a process, in which light reciprocates and interferes with each other, may be referred to as a micro cavity. From a viewpoint as described above, one of the first and second electrodes EL1 and EL2 may be a reflective electrode, and the other may be a transflective electrode. When the first electrode EL1 is a reflective electrode and the second electrode EL2 is a transflective electrode, the display device is a top emission type display device, in which light generated in the first organic layer 110 is extracted in the second electrode EL2 direction. When the first electrode EL1 is a transflective electrode and the second electrode EL2 is a reflective electrode, the display device is a bottom emission type display device, in which light generated in the first organic layer 110 is extracted in the first electrode EL1 direction.

Light resonance may be generated in a space between the first and second electrodes EL1 and EL2. More particularly, light of a wavelength intended for each pixel PX may be resonated by adjusting distance "d" between the first and second electrodes EL1 and EL2. From a standpoint as described above, each of the pixels PX may have an inherent distance value "d" between the first and second electrodes EL1 and EL2. For example, a pixel including a red organic light emitting layer, a pixel including a green organic light emitting layer, and a pixel including a blue organic light emitting layer may respectively have distance values "d" that may be different from each other, between the first and second electrodes EL1 and EL2. A distance between the first and second electrodes of a first pixel emitting light of a first color is different from a distance between the first and second electrodes of a second pixel emitting light of a second color different from the first color.

The distance "d" between the first and second electrodes EL1 and EL2 may refer to a vertical distance from the first electrode EL1 to the second electrode EL2. Specifically, the distance "d" may refer to a shortest vertical distance from the first electrode EL1 to the second electrode EL2.

Although the display device 10 according to an exemplary embodiment may lose a resonant structure, in which light generated in the first organic layer 110 may be resonated by a portion corresponding to the second hole H2 of the second electrode EL2, when Equation 2 is satisfied, an amount of light extracted through increased light extraction path may be greater than the amount of light lost due to loss of a resonant structure, and thus overall light extraction efficiency may be increased.

Each of the second inner walls 140 of the second electrode EL2 may have a greater surface roughness value than a surface in contact with the first organic layer 110 of the second electrode EL2 in the hole forming process. A light-scattering effect of light extracted from the first organic layer 110 may be relatively large, due to the relatively great surface roughness value of each of the second inner walls 140, and thus overall light extraction efficiency may be further improved. An additional process may be performed so as to increase the surface roughness value of each of the second inner walls 140.

Figure 6:
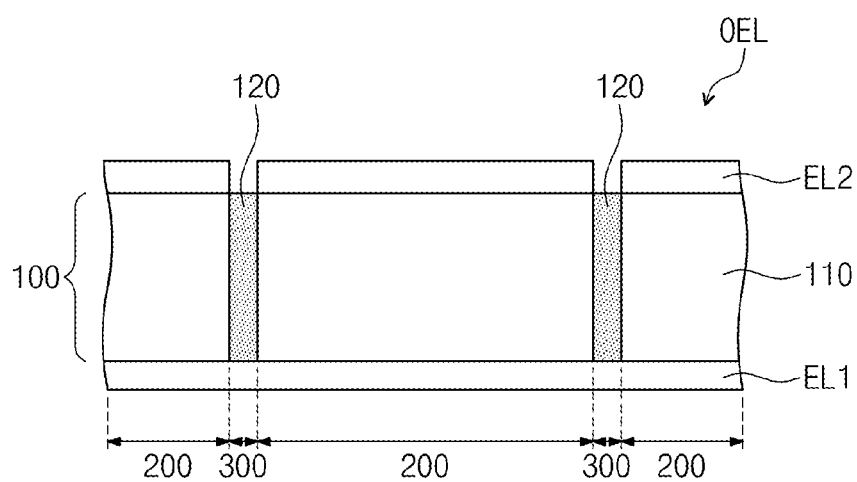
FIG. 6 schematically illustrates an enlarged cross-sectional view of a portion of an organic light emitting diode of FIG. 4.

Referring to FIG. 6, a display device according to an exemplary embodiment may further include a second organic layer 120 disposed on at least a portion of the first non-overlapping electrode portion 300.

The second organic layer 120 may be connected to the first organic layer 110. In other words, the second organic layer 120 is connected to the first organic layer 110 and may be formed integrally. The first and second organic layers 110 and 120 are connected to each other in an integrated layer to form one organic layer 100. The second organic layer 120 may be provided only on a portion of the first non-overlapping electrode portion 300 as described above.

Alternatively, the second organic layer 120 may be disposed on entire area of the first non-overlapping electrode portion 300. In this case, only the second electrode EL2 includes a region not overlapping the first electrode ELL In this case, since a hole H1 is drilled only in the second electrode EL2, the process may be more economically feasible. The second organic layer 120 may be provided on at least a portion of the first non-overlapping electrode portion 300 as a typical method known in the art.

A display device according to an exemplary embodiment may further include an organic capping layer (not shown) disposed on the first non-overlapping electrode portion 300 and the second electrode EL2. When the second organic layer 120 connected to the first organic layer 110 is provided on the first non-overlapping electrode portion 300, the organic capping layer may be provided only on the second electrode EL2. When a difference between refractive indices of the organic capping layer and the organic layer becomes smaller, the effect of light extraction may be increased. A refractive index may be defined as a ratio of light velocity in vacuum with respect to light velocity in a medium, and is represented by relative velocity of light in a medium. Accordingly, when the refractive indices between the organic capping layer and the first organic layer 110 are matched with each other, the transmission of light may not be affected, so that light may be extracted more easily. From a standpoint as described above, when the second organic layer 120 connected to the first organic layer 110 is provided on the first non-overlapping electrode portion 300, it is preferable that refractive indices of the second organic layer 120 and the organic capping layer are the same.

As described above, the first non-overlapping electrode portion 300 may be formed by a region not overlapping the first electrode EL1 on the first organic layer 110 and the second electrode EL2. That is, the first non-overlapping electrode portion 300 may be formed by respectively drilling a hole in the first organic layer 110 and the second electrode EL2. The shape, the size, the number, etc. of the first non-overlapping electrode portion 300 may correspond to the shape, the size, the number, etc. of the hole, as viewed from above, and may be selected in consideration of improving the degree of light extraction efficiency, process economic feasibility, etc. For example, as an increased rate of an output light amount may be large as an exciton formed in the first organic layer 110 becomes closer to a region not overlapping the first electrode EL1 of the first organic layer 110, i.e., a region forming the first non-overlapping electrode portion 300, the shape, the size, and the number of the first non-overlapping electrode portion 300 as viewed from above may be adjusted in consideration of the above-described matters.

FIGS. 7A, 7B, 7C, 7D, and 7E illustrate plan views of display devices according to an exemplary embodiment. Referring to FIGS. 7A, 7B, 7C, 7D, and 7E, the first non-overlapping electrode portions 300 may have a variety of shapes as viewed from above.

The shape of the first non-overlapping electrode portion 300 as viewed from above may be defined by at least one of straight lines and curved lines. More specifically, referring to FIGS. 7C, 7D, and 7E, the shape of the first non-overlapping electrode portion 300 may have a cross shape, a spiral shape, and a rectangular shape, respectively. In addition, the shape may be a circle, a straight, or the like.

Figure 7A:
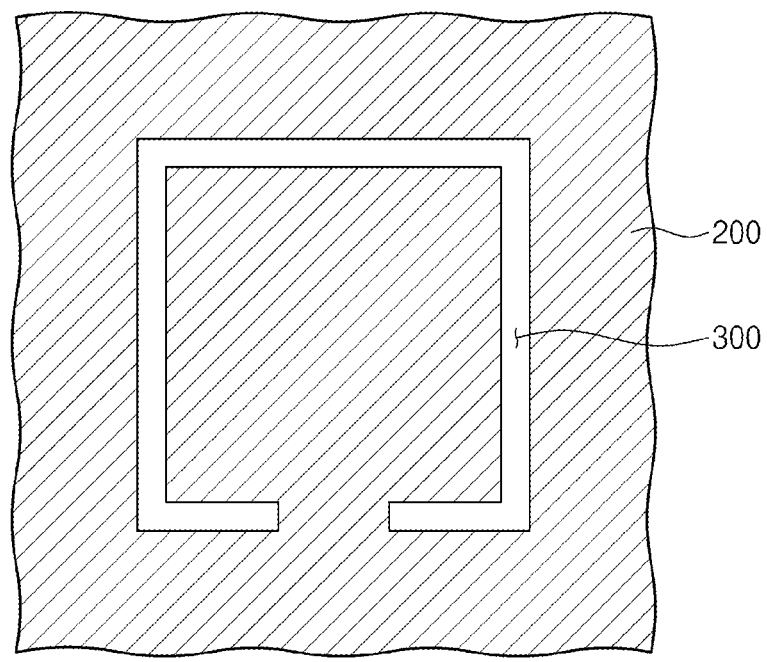
FIG. 7A, FIG. 7B, FIG. 7C, FIG. 7D, and FIG. 7E illustrate plan views of a display device according to an exemplary embodiment.
Figure 7B:
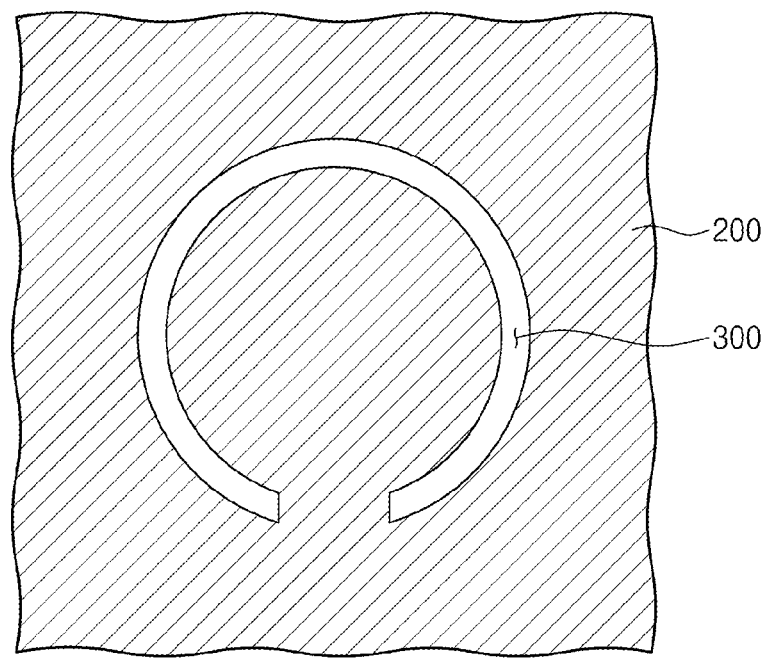
Figure 7C:
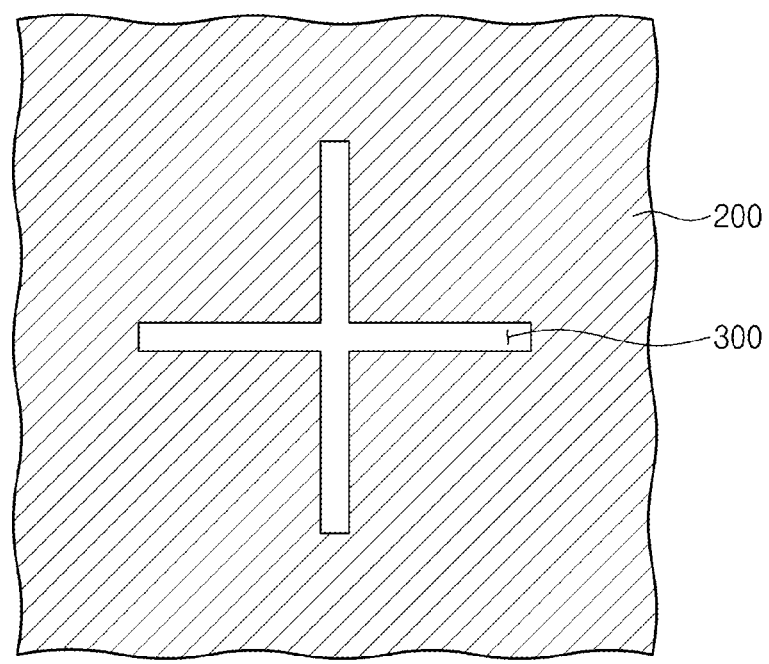
Figure 7D:
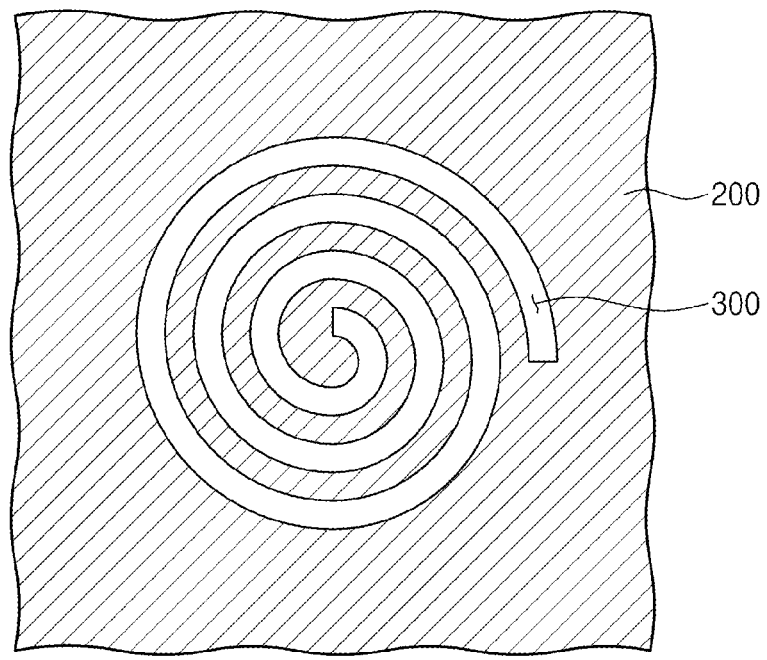
Figure 7E:
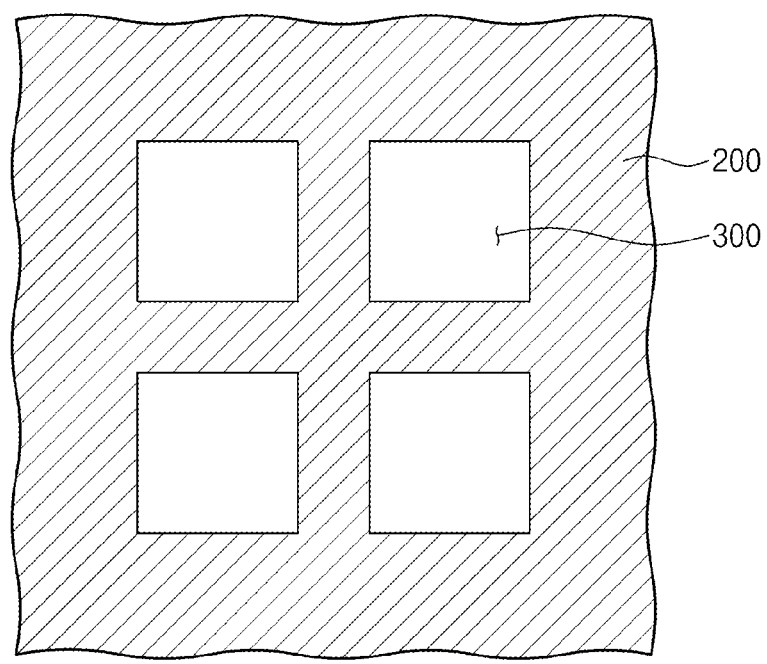

Referring to FIG. 7E, multiple first non-overlapping electrode portions 300 may be provided as viewed from above. The first non-overlapping electrode portions 300 may be spaced apart from each other. For example, the first non-overlapping electrode portions 300 may have multiple rectangular shapes.

Figure 8:
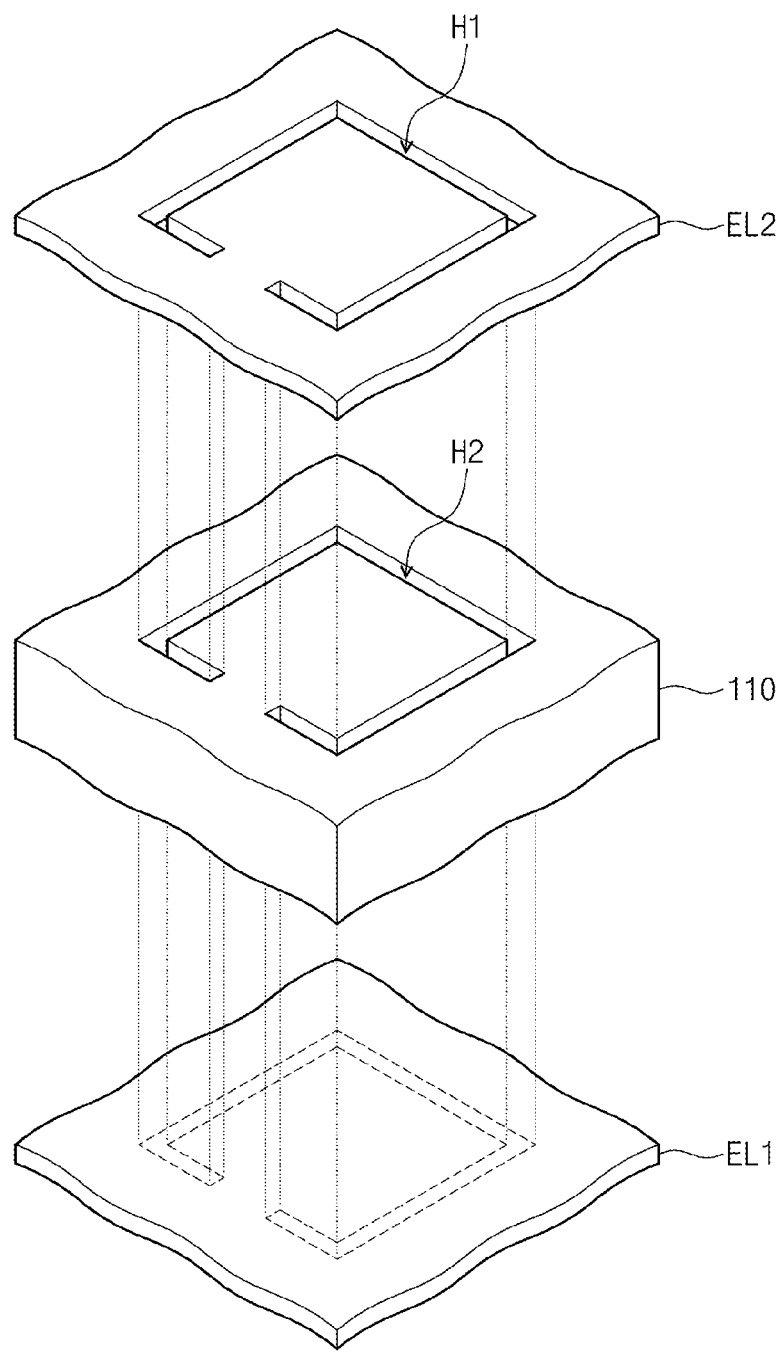
FIG. 8 illustrates an exploded perspective view of an organic light emitting diode included in a display device according to an exemplary embodiment.
Figure 9:
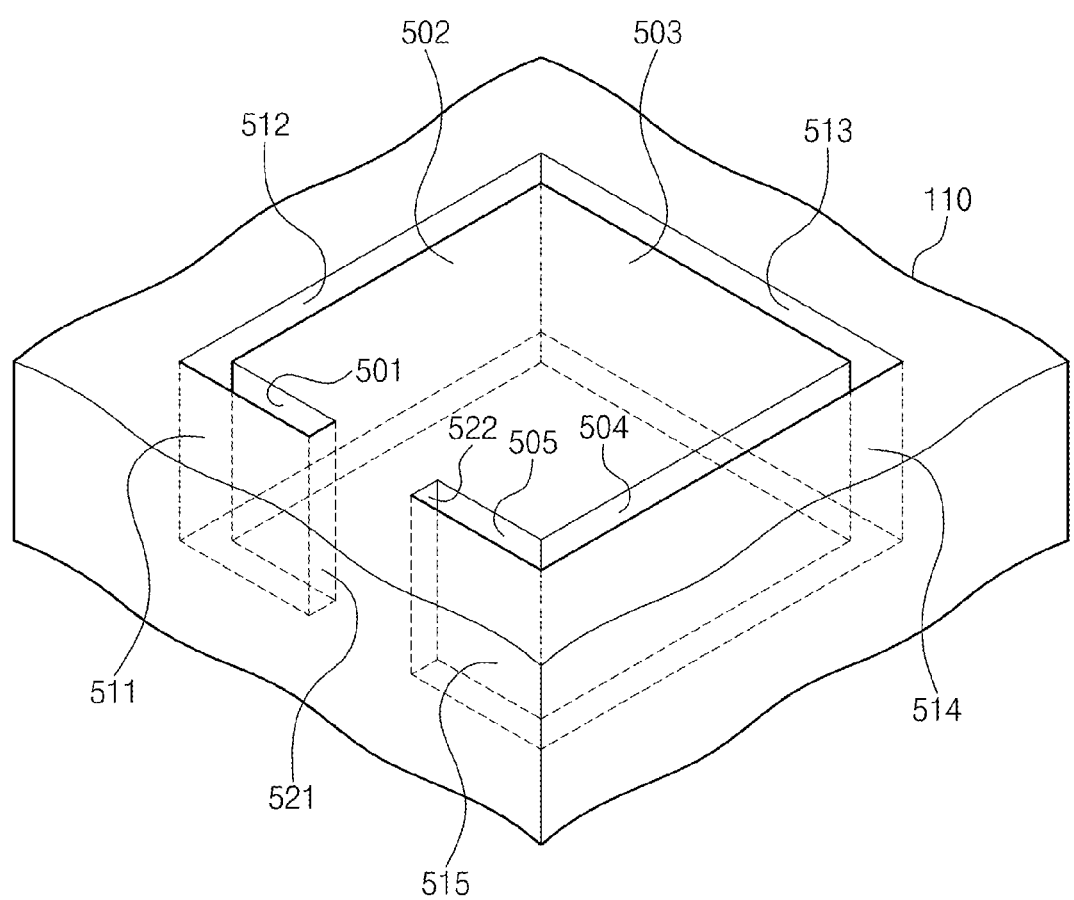
FIG. 9 illustrates a perspective view of a first organic layer included in a display device according to an exemplary embodiment.
Figure 10:
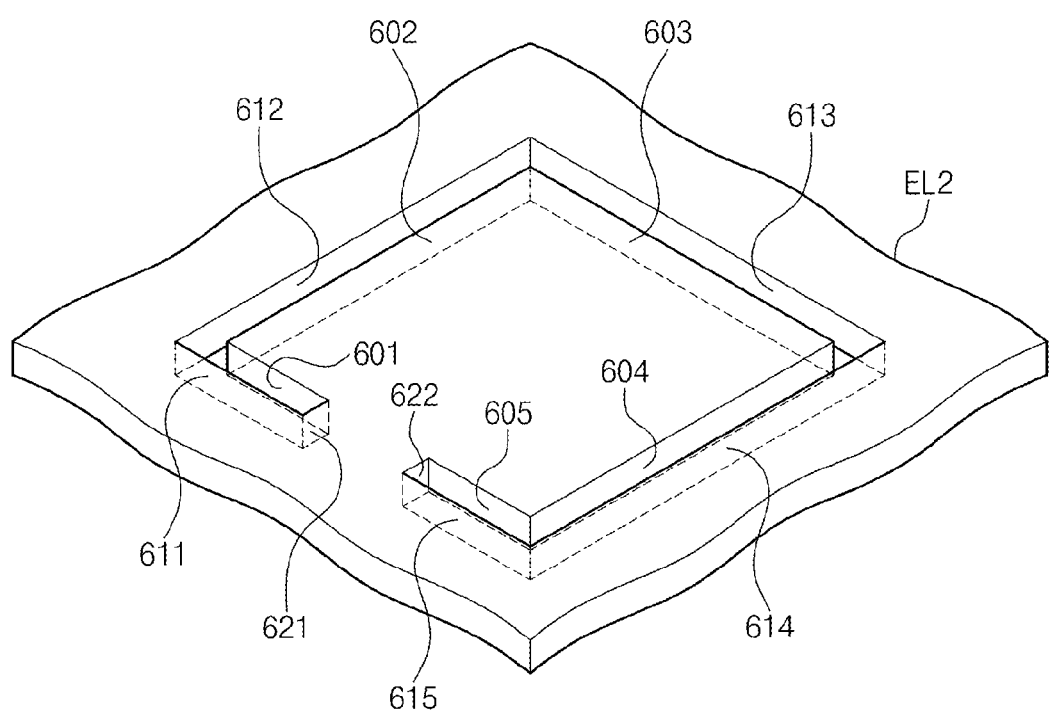
FIG. 10 illustrates a perspective view of a second organic layer included in a display device according to an exemplary embodiment.

FIG. 8 illustrates an exploded perspective view of an organic light emitting diode OEL included in a display device 10 according to an exemplary embodiment. In the exploded perspective view, the first electrode EL1, the first organic layer 110, and the second electrode EL2 may be spaced apart from each other in parallel, such that the first electrode EL1, the first organic layer 110, and the second electrode EL2 may overlap each other.

Specifically, referring to FIGS. 5 to 13, the first non-overlapping electrode portion 300 and the first and second holes H1 and H2 overlap each other. In other words, a region of the second electrode EL2 not overlapping the first electrode EL1, and a region of the first organic layer 110 not overlapping the first electrode EL1 may overlap each other. More specifically, the shapes and the areas of the shapes of the first and second holes H1 and H2 as viewed from above may be the same as each other.

As the region of the second electrode EL2 not overlapping the first electrode EL1 and the region of the organic layer 110 not overlapping the first electrode EL1 overlap each other, the first non-overlapping electrode portion (300 in FIG. 5) may be exposed as viewed from above, as illustrated in FIG. 7A. That is, the shape of the first non-overlapping electrode portion (300 in FIG. 5) as viewed from above is determined by the region of the second electrode EL2 not overlapping the first electrode EL1 and the region of the organic layer 110 not overlapping the first electrode EL1.

The region of the second electrode EL2 not overlapping the first electrode EL1 and the region of the organic layer 110 not overlapping the first electrode EL1 may be formed by drilling the second and first holes H2 and H1 on the first organic layer 110 and the second electrode EL2, respectively. The second and first holes H2 and H1 may be drilled at the same time or through separated processes.

The first sub-region 500 of the first organic layer 110 and the first sub-region 600 of the second electrode EL2 overlap each other, the second sub-region 510 of the first organic layer 110 and the second sub-region 610 of the second electrode EL2 overlap each other, and the third sub-region 520 of the first organic layer 110 and the third sub-region 620 of the second electrode EL2 overlap each other. More specifically, the shapes and the areas of the shapes of the first sub-region 500 of the first organic layer 110 and the first sub-region 600 of the second electrode EL2 as viewed from above may be the same, the shapes and the areas of the shapes of the second sub-region 510 of the first organic layer 110 and the second sub-region 610 of the second electrode EL2 as viewed from above may be the same, and the shapes and the areas of the shapes of the third sub-region 520 of the first organic layer 110 and the third sub-region 620 of the second electrode EL2 as viewed from above may be the same.

Figure 11:
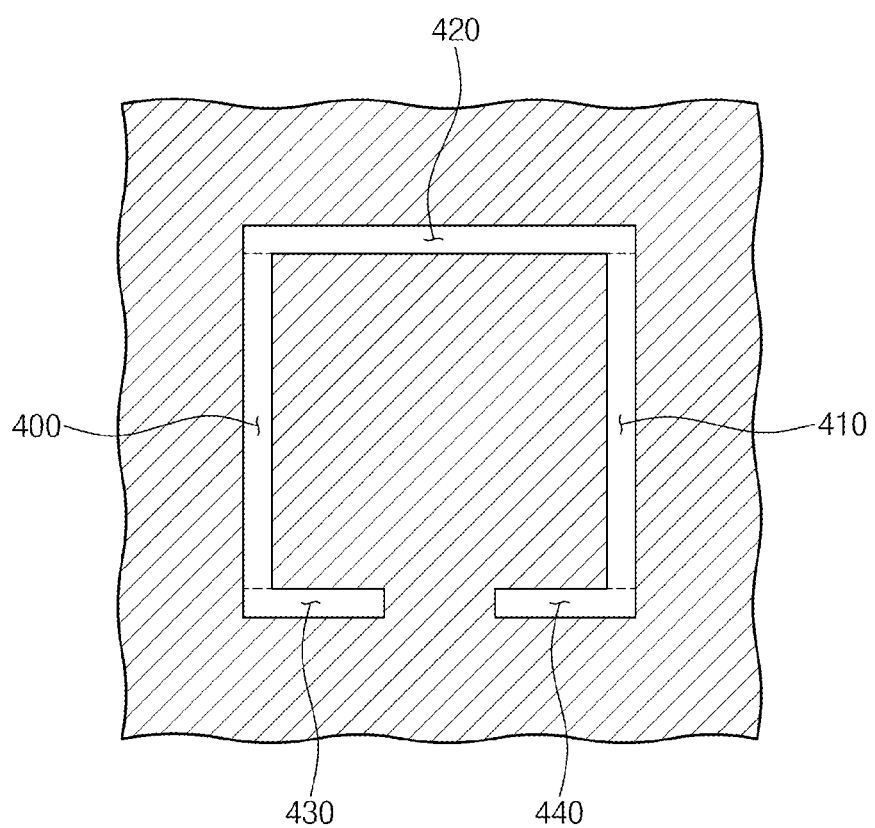
FIG. 11 illustrates a plan view of a first electrode included in a display device according to an exemplary embodiment.

FIG. 11 illustrates a plan view of a first electrode EL1 included in a display device according to an exemplary embodiment. The first non-overlapping electrode portion 300 as viewed from above may include a first region 400, a second region 410, a third region 420, a fourth region 430, and a fifth region 440.

The first region 400 may have a rectangular shape. The second region 410 is spaced apart from the first region 400. The second region 410 may face the first region 400 in the first direction. Specifically, the second region 410 may face and be spaced apart from the first region 400 in the first direction. The second region 410 may have a rectangular shape. The shapes and the areas of the first and second regions 400 and 410 may be the same.

The third region 420 connects the first and second regions 400 and 410 to each other. For example, the third region 420 is disposed at one ends of the first and second regions 400 and 410 to connect the first and second regions 400 and 410 to each other. The third region 420 may have a rectangular shape. The fourth region 430 is connected to the first region 400. The fourth region 430 may be connected to, e.g., the other end of the first region 400. The fourth region 430 may have a rectangular shape. The fourth and fifth regions 430 and 440 may be spaced apart from each other.

The fifth region 440 is connected to the second region 410. For example, the fifth region 440 may be connected to the other end of the second region 410. The fifth region 440 may have a rectangular shape. Each of the fourth and fifth regions 430 and 440 may face the third region 420 in the second direction. The shapes and areas of the fourth and fifth regions 430 and 440 may be the same. Each of the first and second regions 400 and 410 may extend, e.g., in the second direction. Each of the third, fourth, and fifth regions 420, 430, and 440 may extend, e.g., in the first direction.

Figure 12:
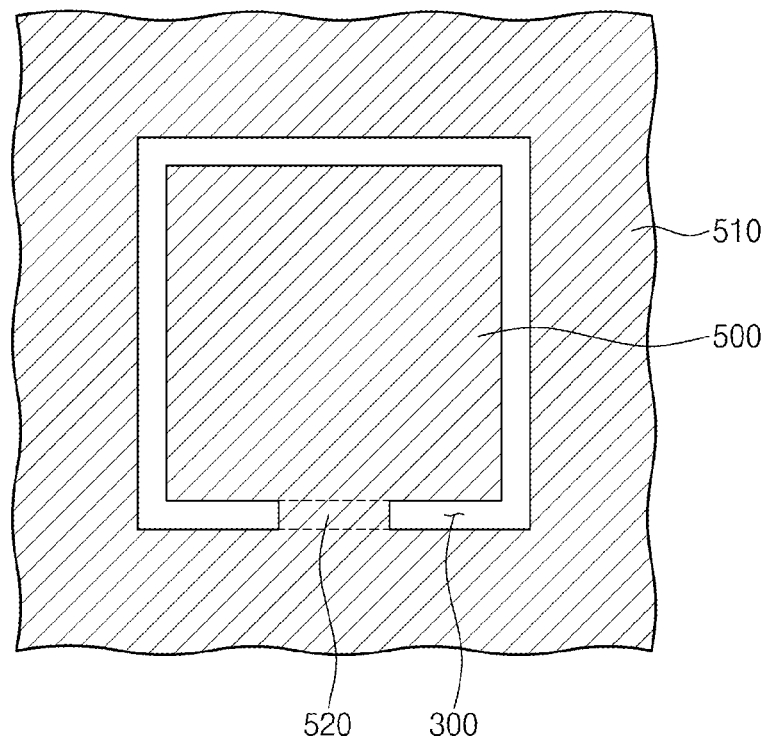
FIG. 12 illustrates a plan view of a first organic layer included in a display device according to an exemplary embodiment.

FIG. 12 illustrates a plan view of the first organic layer 110 included in the display device 10 according to an exemplary embodiment. The first organic layer 110 may include the first sub-region 500, the second sub-region 510, and the third sub-region 520 as viewed from above.

The first sub-region 500 of the first organic layer 110 may have a rectangular shape. Alternatively, the first sub-region 500 of the first organic layer 110 may have a circular shape.

The second sub-region 510 of the first organic layer 110 is spaced apart from the first sub-region 500 of the first organic layer 110. The second sub-region 510 of the first organic layer 110 may have, e.g., a rectangular ring shape. Alternatively, the second sub-region 510 of the first organic layer 110 may have a different shape.

The third sub-region 520 of the first organic layer 110 connects the first sub-region 500 of the first organic layer 110 and the second sub-region 510 of the first organic layer 110 to each other. Specifically, the third sub-region 520 of the first organic layer 110 connects the first sub-region 500 of the first organic layer 110 and a portion of the second sub-region 510 of the first organic layer 110 to each other. The third sub-region 520 of the first organic layer 110 may have, e.g., a rectangular shape. For example, each of the first sub-region 500 and the third sub-region 520 of the first organic layer 110 has a rectangular shape and the respective areas thereof are different from each other.

Figure 13:
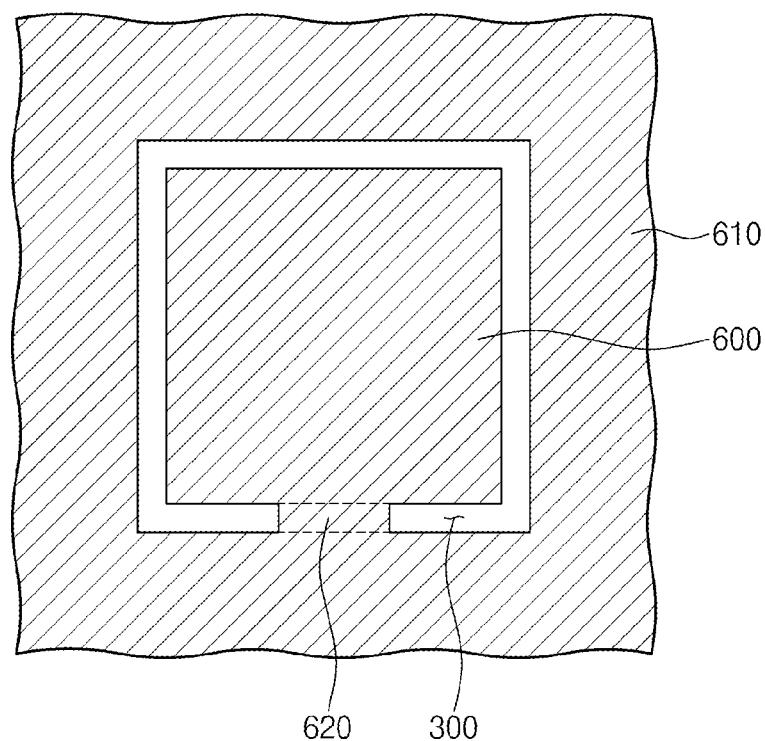
FIG. 13 illustrates a plan view of a second electrode included in a display device according to an exemplary embodiment.

FIG. 13 illustrates a plan view of the second electrode EL2 included in a display device 10 according to an exemplary embodiment. The second electrode EL2 may include the first sub-region 600, the second sub-region 610, and the third sub-region 620 as viewed from above.

The first sub-region 600 of the second electrode EL2 may have a rectangular shape. Alternatively, the first sub-region 500 of the second electrode EL2 may have a circular shape.

The second sub-region 610 of the second electrode EL2 is spaced apart from the first sub-region 600 of the second electrode EL2. The second sub-region 610 of the second electrode EL2 may have, e.g., a rectangle ring shape. Alternatively, the second sub-region 610 of the second electrode EL2 may have a different shape.

The third sub-region 620 of the second electrode EL2 connects the first sub-region 600 of the second electrode EL2 and the second sub-region 610 of the second electrode EL2 to each other. Specifically, the third sub-region 620 of the second electrode EL2 connects the first sub-region 600 of the second electrode EL2 and a portion of the second sub-region 610 of the second electrode EL2 to each other. The third sub-region 620 of the second electrode EL2 may have, e.g., a rectangle shape. For example, each of the first sub-region 600 and the third sub-region 620 of the second electrode EL2 has a rectangle shape and the respective areas thereof are different from each other.

The first sub-region 600 of the second electrode EL2 may be disposed on the first sub-region 500 of the first organic layer 110. The first sub-region 500 and the first sub-region 600 of the first organic layer 110 may have the same area. The second sub-region 610 of the second electrode EL2 may be disposed on the second sub-region 510 of the first organic layer 110. The second sub-region 510 of the organic layer 110 and the second sub-region 610 of the second electrode EL2 may have the same area. The third sub-region 620 of the second electrode EL2 may be disposed on the third sub-region 520 of the first organic layer 110. The third sub-region 520 of the first organic layer 110 and the third sub-region 620 of the second electrode EL2 may have the same area.

The first electrode EL1 included in the display device 10 according to an exemplary embodiment includes the first non-overlapping electrode portion 300 not overlapping each of the first organic layer 110 and the second electrode EL2. The first electrode EL1 may be formed by sequentially disposing the first organic layer 110 including the second hole H2 and the second hole H2 including the first hole H1, so that a path, in which light formed in the organic layer 110 may be extracted, may be increased to improve light extraction efficiency of a display device.

In conventional display devices including an organic layer, which may entirely overlap the first electrode, when the size of each pixel increases, an amount of light absorbed in the organic layer may be large before the light is extracted, and thus an amount of light loss may be large. According to an exemplary embodiment, light extraction efficiency of a display device may be increased regardless of the size of each of the pixels.

The display device 10 according to an exemplary embodiment may include pixels PX, and each of the pixels PX includes the first electrode EL1, the first organic layer 110 disposed on the first electrode EL1, and the second electrode EL2 including the first hole H1 disposed on the first organic layer 100. The first organic layer 100 may include the second hole H2 overlapping the first hole H1. As described above, since the first and second holes H1 and H2 may be extraction paths of light generated in the organic layer 100, light extraction efficiency of a display device may be improved.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display device, comprising:
   pixels, each pixel comprising:
      a first electrode;
      a first organic layer disposed on the first electrode; and
      a second electrode disposed on the first organic layer,
   wherein the first electrode comprises:
      a first overlapping electrode portion overlapping each of the first organic layer and the second electrode; and
      a first non-overlapping electrode portion not overlapping the first organic layer and the second electrode, and connected to the first overlapping electrode portion, and
   wherein the first overlapping electrode portion surrounds the first non-overlapping electrode portion, as viewed from above.

2. The display device of claim 1, further comprising a second organic layer disposed on at least a portion of the first non-overlapping electrode portion and connected to the first organic layer.

3. The display device of claim 1, wherein the area of the first non-overlapping electrode portion as viewed from above is about 5% to about 30% of the total area of the first electrode.

4. The display device of claim 1, wherein:
   the first organic layer comprises first inner walls and the display device satisfies Equation 1;

$$X > Y \quad \text{Equation 1,}$$

where X refers to a sum of the respective areas of the first inner walls and Y refers to a total area of first non-overlapping electrode portions, as viewed from above.

5. The display device of claim 1, wherein:
   the second electrode comprises second inner walls and the display device satisfies Equation 2;

$$Z > Y \quad \text{Equation 2,}$$

where Z refers to a sum of areas of the second inner walls and Y refers to a total area of the first non-overlapping electrode portion.

6. The display device of claim 1, wherein the shape of the first non-overlapping electrode portion as viewed from above is defined as at least one of straight lines and curved lines.

7. The display device of claim 1, wherein the first non-overlapping electrode portion comprises;
   a first region;
   a second region spaced apart from the first region;
   a third region connecting the first and second regions to each other;
   a fourth region connected to the first region; and
   a fifth region connected to the second region and spaced apart from the fourth region.

8. The display device of claim 7, wherein:
   the third region is disposed at a first end of each of the first and second regions;
   the fourth region is disposed at a second end of the first region; and
   the fifth region is disposed at the second end of the second region.

9. The display device of claim 1, wherein the first non-overlapping electrode portion is provided in plurality and the plurality of first non-overlapping portions as viewed from above are spaced apart from each other.

10. The display device of claim 1, wherein the first organic layer as viewed from above comprises:
    a first sub-region;
    a second sub-region spaced apart from the first sub-region; and
    a third sub-region connecting the first and second sub-regions to each other.

11. The display device of claim 10, wherein:
    each of the first and third sub-regions has a rectangular shape; and
    the second sub-region has a rectangular ring shape.

12. The display device of claim 1, wherein the second electrode as viewed from above comprises:
    a first sub-region;
    a second sub-region spaced apart from the first sub-region; and
    a third sub-region connecting the first and second sub-regions to each other.

13. The display device of claim 12, wherein:
    each of the first and third sub-regions has a rectangle shape; and
    the second sub-region has a rectangle ring shape.

14. The display device of claim 1, wherein:
    the first organic layer as viewed from above comprises:
       a first sub-region;
       a second sub-region spaced apart from the first sub-region; and
       a third sub-region connecting the first and second sub-regions to each other;
    the second electrode comprises:
       a first sub-region;
       a second sub-region spaced apart from the first sub-region; and
       a third sub-region connecting the first and second sub-regions to each other;
    the first sub-region of the second electrode is disposed on the first sub-region of the first organic layer;
    the second sub-region of the second electrode is disposed on the second sub-region of the first organic layer; and the third sub-region of the second electrode is disposed on the third sub-region of the first organic layer.

15. The display device of claim 1, wherein one of the first and second electrodes comprises a reflective electrode, and the other of the first and second electrodes comprises a transflective electrode.

16. The display device of claim 1, wherein a distance between the first and second electrodes of a first pixel emitting light of a first color is different from a distance between the first and second electrodes of a second pixel emitting light of a second color different from the first color.

17. The display device of claim 1, wherein the first organic layer comprises a hole transport region, an emitting layer, and an electron transport region.

18. A display device, comprising:
pixels, each pixel comprising:
a first electrode;
a first organic layer disposed on the first electrode; and
a second electrode disposed on the first organic layer,
wherein the first electrode comprises:
a first overlapping electrode portion overlapping each of the first organic layer and the second electrode; and
first non-overlapping electrode portions spaced apart from each other as viewed from above, not overlapping the first organic layer and the second electrode, and connected to the first overlapping electrode portion.

* * * * *